July 21, 1970 G. E. BODWAY ET AL 3,521,134

SEMICONDUCTOR CONNECTION APPARATUS

Filed Nov. 14, 1968

INVENTORS
GEORGE E. BODWAY
SANEHIKO KAKIHANA

BY A. C. Smith

ATTORNEY

United States Patent Office 3,521,134
Patented July 21, 1970

3,521,134

SEMICONDUCTOR CONNECTION APPARATUS

George E. Bodway, Mountain View, and Sanehiko Kakihana, Los Altos, Calif., assignors to Hewlett-Packard Company, Palo Alto, Calif., a corporation of California Filed Nov. 14, 1968, Ser. No. 775,829
Int. Cl. H01l *1/12*
U.S. Cl. 317—234 3 Claims

ABSTRACT OF THE DISCLOSURE

The region of a semiconductor body near which a circuit element is formed is removed and a metallic contact pad is formed in the removed region to provide a mounting pad of high thermal and electrical conductivity in close proximity to the circuit element.

BACKGROUND OF THE INVENTION

Conventional semiconductor devices such as transistors, diodes, and the like, include surface connection tabs to which connecting leads may be bonded. Beam leads are also used on such devices to provide the surface connection tabs and the connecting leads as integral conductors. One disadvantage in devices of this type is that the surface connections to the circuit element introduce relatively high thermal and electrical resistance between the collector region and the external environment and also increase interelectrode capacitance. The electrical resistance in combination with the electrode capacitance deteriorates high frequency performance and the thermal resistance decreases the power-handling capability of the device.

SUMMARY OF THE INVENTION

Accordingly, the present invention provides a bulk contact pad in close proximity to the heat-generating portions of a circuit element within a semiconductor. The contact pad of the present invention serves as the connection to external circuitry and also serves as an improved heat sink and heat conduction path for the semiconductor device. This greatly enhances the power-handling capabilities of the present device over conventional beam lead devices and over standard devices in which the contact is disposed on the back side of the body.

DESCRIPTION OF THE PREFERRED EMBODIMENT

Figure 1:
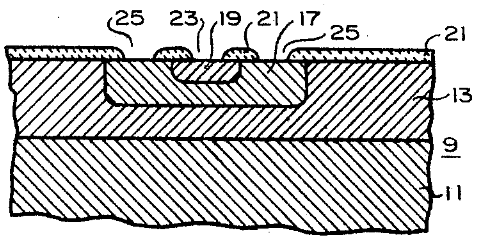
FIGS. 1 through 3 and 5 and 6 are sectional views of a device in various stages of completion according to the present invention.

Referring now to FIG. 1 there is shown a body 9 of semiconductor material which may include a monocrystalline substrate 11 of low resistivity and a contiguous epitaxial layer 13 formed by conventional means on a surface of the substrate. The substrate 11 may be heavily-doped n+ conductivity-type monocrystalline silicon and the epitaxial layer 13 may be n-type silicon material of desired resistivity. Base region 17 may be formed in the epitaxial layer 13 by diffusing p-type impurities into the layer 13 using conventional masking and diffusing techniques. An emitter region 19 may then be formed in the base region 17 by diffusing n-type impurities into the base region using conventional masking and diffusing techniques. The surface contour of the emitter and base regions may, of course, be in the shape of an interdigital or star or "bull's-eye" pattern for lower contact resistance and improved current distribution. An insulating layer 21 of silicon dioxide or silicon nitride, or the like, covers the surface of the body 9 and exposes the base region and emitter region through apertures 23 and 25, respectively, in the layer 21.

Figure 2:
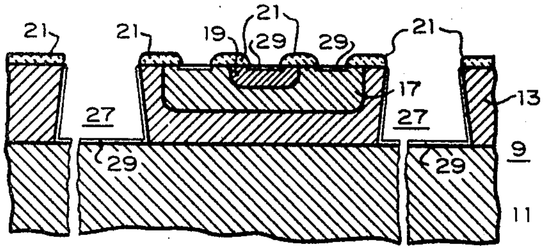

The epitaxial layer may then be removed, for example, by etching down to a selected depth such as the monolithic substrate in the regions 27 closely proximate the surface contour of the active regions 17, 19 of the device thus formed, as shown in FIG. 2. This exposes the region of the body 9 closely adjacent the collector-base junction where most of the heat is generated.

Figure 3:
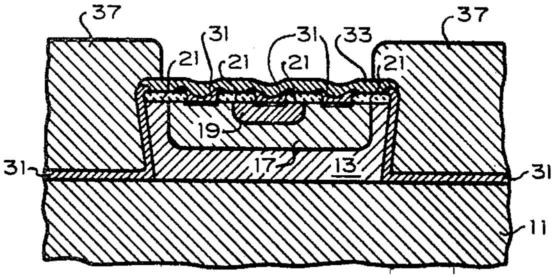

After the semiconductor material has been removed from the regions 27 adjacent the active regions 17, 19, the exposed areas of semiconductor material may be coated with platinum using conventional deposition processes such as sputtering or electron-beam deposition. The body 9 is then heated at a temperature of about 600° C. for about four minutes to form platinum silicide on the exposed silicon surfaces of the body 9. The remaining platinum may be etched away in heated aqua regia leaving platinum silicide 29 on the surface areas unprotected by insulating layer 21. Platinum silicide is an excellent ohmic contact material which has low resistance and high adhesion to silicon. Multi-metal electrodes 31 including, for example, about 1500 A.–2500 A. of molybdenum and about 6000 A.–7000 A. of gold may then be formed over the regions of platinum silicide, for example, by sputtering to a thickness of about 7500 A.–9500 A., as shown in FIG. 3, to provide conductive connections to the regions 11, 13, 17 and 19. An oxide (or other insulating) layer 33 is then deposited over the entire structure and holes are etched through the oxide 33 where the gold is to be electroplated.

Figure 4:
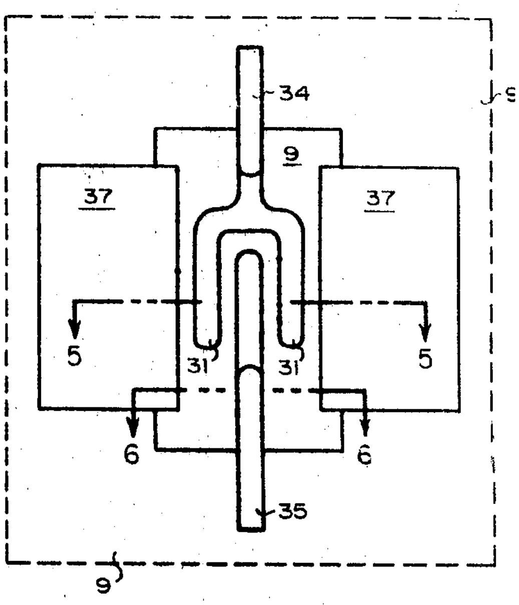
FIG. 4 is a plan view of the present device showing the arrangement of electrodes.
Figure 5:
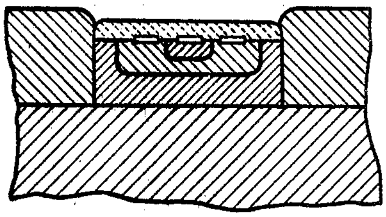
Figure 6:
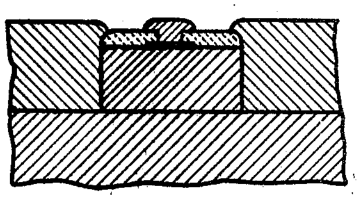

The conductive electrodes 31 may be electroplated with gold to build them up to a desired thickness. Where interdigital electrode patterns of small dimensions and spacings are used, the gold electroplating may be dispensed with to preserve the pattern resolution, as shown in FIG. 5, and to avoid undesirable bridging and electrode shorting. However, the electroplating techniques may be used where it is desired to build up the external electrode connections 34, 35 and 37 to a thickness of about 7.5 to 10 microns, as shown in FIGS. 3, 4 and 6. The excess portions of the body 9 may be etched away leaving the collector pads 37 and the base and emitter connections 35 and 34, respectively, protruding beyond the edges of the body 9, as shown in FIG. 4. The collector electrodes 37 may thus extend laterally away from the regions 17 and 19 any desired distance without significantly altering the electrode capacitance of the device. As a result, the connection pad or electrode 37 which is connected to the collector region including the highly conductive semiconductor substrate 11 and the epitaxial layer 13 serves as a mounting pad that provides a thermal conduction path to the external environment as well as electrical connection to the collector. Also, the base and emitter electrodes may be made smaller, thereby reducing electrode capacitance, because these electrodes do not serve as supports for the device. The present configuration thus assures higher power-handling capability, lower collector resistance and improved high frequency performance compared with devices which use conventional surface connections. Where the present device cannot be directly mounted on a heat sink, as is the case when the device forms a portion of an integrated circuit, the collector connection pads 37 of the present invention aid in distributing the heat generated near the base-collector junction of a transistor over a large area of the integrated circuit. It should be noted, however, that the present invention is not limited to transistor applications but may be used with other circuit elements.

Therefore, the present invention improves the power-handling capability of a semiconductor device by providing a highly conductive thermal path which conducts heat to an external environment from a location within the device close to a dissipative region thereof. Also, the present invention reduces connection resistance to the active regions within the semiconductor body by positioning the connection pad or electrode in close proximity to the active region within the semiconductor body. Further, the present invention reduces the inductance and capacitance of the electrodes and connections to the device and thereby improves the high frequency performance of the device.

What is claimed is:

1. Semiconductor apparatus comprising: a substrate;
a semiconductor body of one conductivity type on said substrate;
a region of another conductivity type within a selected surface area of said body and extending into said body from said surface area; and
a heat conductive electrical contact, spaced from said region, extending into said body in ohmic connection therewith and forming a heat sink for conducting heat from said body.

2. Semiconductor apparatus as in claim 1 wherein:
said region and said electrical contact extend into said body from the same surface; and
said electrical contact extends into said body to a depth at least as great as the depth to which said region extends.

3. Semiconductor apparatus as in claim 1 wherein:
said body includes an epitaxial layer and the substrate is monocrystalline material and is contiguous said epitaxial layer;
said region extends into said epitaxial layer a distance less than the thickness of said layer; and
said electrical contact extends through said layer substantially to said substrate.

References Cited

UNITED STATES PATENTS

| | | | |
|---|---|---|---|
| 2,861,018 | 11/1958 | Fuller et al. | 317—234 X |
| 3,138,747 | 6/1964 | Stewart | 317—235 |
| 3,152,294 | 10/1964 | Siebertz et al. | 317—235 |
| 3,173,101 | 3/1965 | Stelmock | 330—37 |

JAMES D. KALLAM, Primary Examiner

U.S. Cl. X.R.

29—576